(12) United States Patent
Nashimoto

(10) Patent No.: US 6,242,765 B1
(45) Date of Patent: *Jun. 5, 2001

(54) FIELD EFFECT TRANSISTOR AND ITS MANUFACTURING METHOD

(75) Inventor: Yasunobu Nashimoto, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/562,640

(22) Filed: Nov. 27, 1995

Related U.S. Application Data

(63) Continuation of application No. 07/886,254, filed on May 21, 1992, now abandoned.

(30) Foreign Application Priority Data

| May 21, 1991 | (JP) | 3-115214 |
| Jul. 11, 1991 | (JP) | 3-170789 |
| Oct. 25, 1991 | (JP) | 3-279542 |

(51) Int. Cl.[7] ............... H01L 31/0328; H01L 31/0336
(52) U.S. Cl. .......................... 257/192; 257/194
(58) Field of Search ............... 257/20, 192, 194

(56) References Cited

U.S. PATENT DOCUMENTS

| 4,769,683 | * | 9/1988 | Goronkin et al. | 257/194 |
| 4,796,068 | * | 1/1989 | Katayama et al. | 257/194 |

(List continued on next page.)

FOREIGN PATENT DOCUMENTS

| 63-52484 | * | 3/1988 | (JP) | 257/194 |
| 63-76380 | * | 4/1988 | (JP) | 257/194 |

(List continued on next page.)

OTHER PUBLICATIONS

Striped Channel Field Effect Transistors With A Modulation Doped Structure, IEDM Technical Digest, 1989, by K. Onda, et al., pp. 125–128.

"Ballistic Electron Transport In A Gated Constriction", Science and Engineering of One– and Zero–Dimensional Semiconductors, pp. 25–31, Thornton et al., edited by S.P. Beaumont and C.M. Sotomajor Torres, Plenum Press, New York 1990.

(List continued on next page.)

Primary Examiner—Steven Loke
(74) Attorney, Agent, or Firm—Burns, Doane, Swecker & Mathis, LLP

(57) ABSTRACT

A hetero-junctioned FET having as its conductive channel a highly mobile electron accumulated layer where electrons are one-dimensionally distributed. This FET is provided with first and second semiconductor layers which, formed on a semiconductor substrate, are different from each other in electron affinity and produce a semiconductor hetero junction, a source electrode and a drain electrode formed on either the first or second semiconductor layer, multiple fine damaged-area stripes formed near the interface of the hetero junction within the first semiconductor layer in the channel area between the source and drain electrodes, and a conductive channel of multiple fine electron accumulated-layer stripes generatred at the locations other than those facing the damaged areas near the interface of the hetero junction within the second semiconductor layer. In this FET, the damaged areas selectively formed at the locations other than those of the conductive channel areas between the source and drain electrodes eliminates, at the locations corresponding to the damaged areas, the electron accumulated layers generated due to a semiconductor hetero junction to function as a conductive channel. This enables a conductive channel to be divided into strips each 0.1 $\mu$m or less wide.

7 Claims, 11 Drawing Sheets

U.S. PATENT DOCUMENTS

| | | | |
|---|---|---|---|
| 5,119,151 | * | 6/1992 | Onda .................................... 257/192 |
| 5,726,467 | * | 3/1998 | Nakagawa ............................ 257/192 |

FOREIGN PATENT DOCUMENTS

| | | | |
|---|---|---|---|
| H1-238176 | | 9/1989 | (JP) ...................................... 257/192 |
| 1-238176 | * | 9/1989 | (JP) ...................................... 257/192 |
| H1-262670 | | 10/1989 | (JP) ...................................... 257/192 |
| 2-134830 | * | 5/1990 | (JP) ...................................... 257/192 |
| 2-189978 | * | 7/1990 | (JP) ...................................... 257/192 |
| H2-273942 | | 11/1990 | (JP) ...................................... 257/192 |

OTHER PUBLICATIONS

IEEE Transactions on Electron Devices, vol. ED–34, No. 11, 11/87, "Performance of the Focused–Ion–Striped Transistor (FIST)—A New MESFET Structure Produced by Focused–Ion–Beam Implanation", by Rensch et al. p,2232–p, 2237.*

* cited by examiner

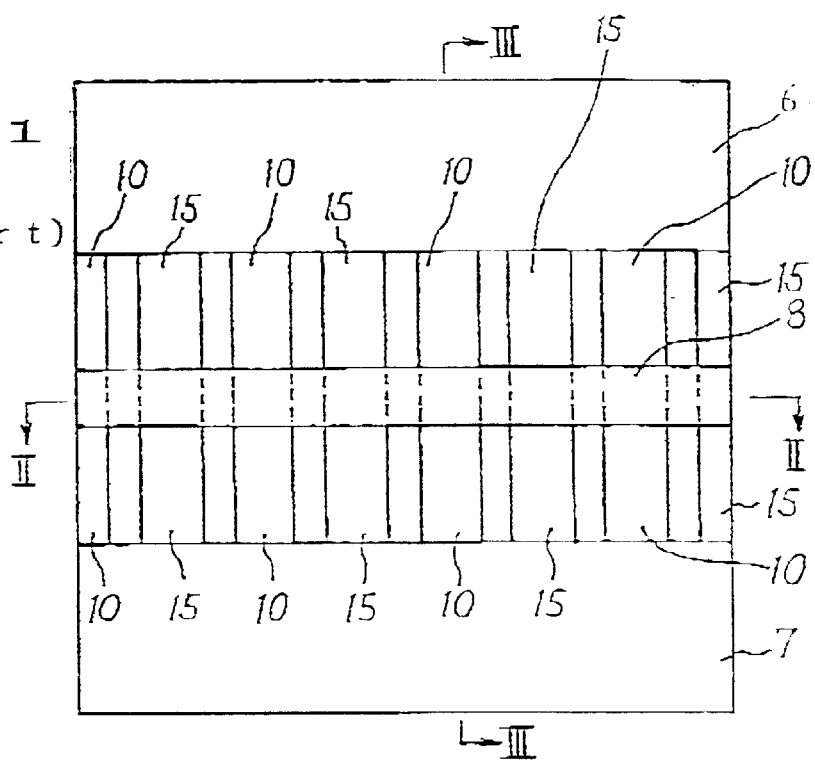
FIG. 1 (Prior Art)
FIG. 2 (Prior Art)
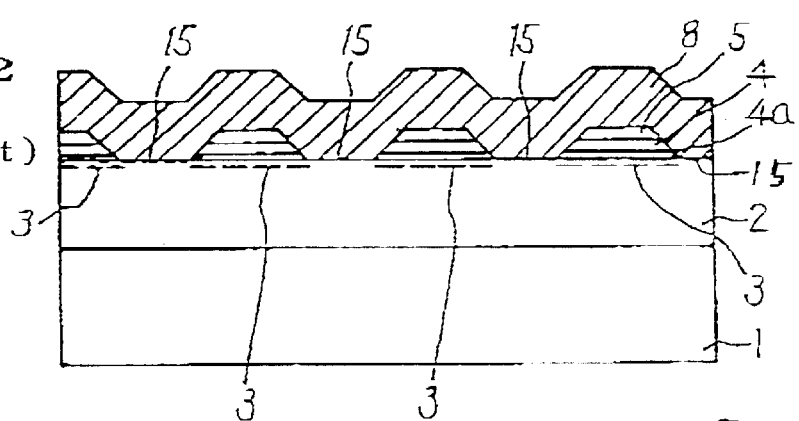
FIG. 3 (Prior Art)

FIELD EFFECT TRANSISTOR AND ITS MANUFACTURING METHOD

This application is a continuation of application Ser. No. 07/886,254, filed May 21, 1992, now abandoned.

BACKGROUND OF THE INVENTION

1. Field of the Invention

This invention relates to afield effect transistor and its manufacturing method, and more particularly, to a hetero-junctioned semiconductor field effect transistor provided with a conductive channel consisting of very fine electron accumulated-layer stripes and its manufacturing method.

2. Description of the Prior Art

The recent development in the technology to grow crystals on a compound semiconductor including the molecular beam epitaxial (MBE) growth method has made it possible to atomically control the layer thickness. This technology can also be used to form a hetero junction of semiconductor layers different in nature and selectively dope the semiconductor layer smaller in electron affinity with impurities so that a highly mobile electron accumulated layer may be generated near the aforementioned hetero junction interface within the layer larger in electron affinity. This field effect transistor (FET) using the electron accumulated layer as a current channel is called "hetero-junctioned FET" or "selectively doped FET" and some excellent in high-frequency response have already been put into practical use.

In anticipation of a further increase in the mobility of electrons to be implemented by the conversion of conventional two-dimensional distribution of electrons to one-dimensional distribution, an attempt has been made to manufacture a FET provided with such a one-dimensionally distributed electron channel. In 1989, Onda, et al. reported on such an FET in IEDM Technical Digest pp. 125–128. A reported FET example is shown in FIG. 1–FIG. 3 and other one in FIG. 4–FIG. 6.

In FIG. 1–FIG. 3, the FET is provided with a high-purity GaAs layer 2, an undoped AlGaAs layer 4a as a spacer, a N-type AlGaAs layer 4 which supplies electrons to an electron accumulated layer 3 generated within the high-purity GaAs layer 2, and a N-type GaAs layer 5 formed in that order by an MBE method on a primary surface of a semi-insulated GaAs substrate. On the surface of the N-type GaAs layer 5, a source electrode 6 and a drain electrode 7 are formed with a channel area therebetween. Within the channel area on the N-type GaAs layer 5, a gate electrode 8 is formed almost in the center between the source electrode 6 and the drain electrode 7.

In the aforementioned channel area, the undoped AlGaAs layer 4a, the N-type AlGaAs layer 4, and the the N-type GaAs layer 5 are partially etched to form grooves 15 called mesas, as shown in FIG. 2. At the bottoms of the grooves 15, the high-purity GaAs layer 2 is exposed. Thus, on the aforementioned channel area, the undoped AlGaAs layer 4a, the N-type AlGaAs layer 4, and the N-type GaAs layer 5 are divided into multiple fine strips 10 with a width of 0.1–1 μm a These strips 10 are formed so as to bridge the source electrode 6 and the drain electrode 7.

Within the high-purity GaAs layer 2, an electron accumulated layer 3 is generated near the interface with the undoped AlGaAs layer 4a. The electron accumulated layer 3 is located only below each of the strips 10 but not below each of the grooves 15. The electron accumulated layer 3 become a conductive channel of the PET. The voltage applied to the gate electrode 8 modulates the potentials of the N-type GaAs layer 5 and the N-type AlGaAs layer 4 to control the current flowing through the electron accumulated layers.

A conventional FET illustrated in FIG. 4–FIG. 6 has almost the same configuration as the aforesaid FET on FIG. 1–FIG. 3 In these figures of both FETs, an element of one FET has the same number as its counterpart of the other. The FET of FIG. 4–FIG. 6 differs from the one of FIG. 1–FIG. 3 in that the former's groove 15a has a roughly rectangular cross section while the latter's groove 15 has a roughly trapezoidal cross section. The other configurations are the same.

It is reported that the aforementioned conventional FETs are both much more excellent in transconductance (gm) at a low temperature and cut-off frequency (fT) than those having no finely divided channel area. It is, therefore, considered that one-dimensional distribution of the electron accumulated layers implemented by finely dividing the conductive channel is quite effective in improving the high-frequency response of the hetero-junctioned FET.

A problem in these conventional FETs is that it is difficult to form a further minute conductive channel with a width of 0.1 μm or less which generates quantum interference effects as a conductive channel is finely divided through the formation of grooves 15 by etching.

Another fine processing-related problem includes a reduced yield rate due to easy formation of a defective gate electrode 8 or 8a on the stepped channel area with grooves 15.

Moreover, it is difficult to form between the source electrode 6 and the drain electrode 7 the grooves of a so-called "recess structure" generally used to reduce series resistance and it is also impossible to increase the impurity concentration in the N-type GaAs 5 layer to prevent the current from leaking from the gate electrode 8 or 8a as the electrodes 8 or 8a form a Schottky junction with the layer 5 This results in a further problem of a failure to obtain expected performance because of larger resistance between the source electrode 6 and the gate electrode 7 than a hetero-junctioned FET whose conductive channel is not finely divided.

Hence, an object of this invention is to provide an FET having a conductive channel with a width of 0.1 μm or less which generates electron quantum interference effects and a method to manufacture such an FET at a favorable yield rate.

Another object of this invention is to provide an FET whose series resistance between the source and the gate electrodes is smaller than a conventional FET whose conductive channel is not finely divided and a method to manufacture such a FET at a favorable yield rate.

SUMMARY OF THE INVENTION (1) In a first aspect of this invention, an FET having conductive channels each 0.1 μm or less wide is provided.

An FET of this aspect comprises first and second semiconductor layers formed on a semiconductor substrate, which are different from each other in electron affinity and produce a hetero junction, source and drain electrodes formed on one of the first and second semiconductor layer a plurality of fine damaged-area stripes formed near the interface of the hetero junction within the first semiconductor layer in the channel area between the source and drain electrodes, a conductive channel of fine electron accumulated area stripes generated at the locations other than those facing the damaged-area stripes near the interface of the hetero junction within the second semiconductor layer.

In such an FET, the damaged-area stripes are selectively formed in the locations other than those of conductive channels between the source and drain electrodes, so that activation of electrons due to doped impurity atoms within the damaged-area stripes is inhibited. As a result, an electron accumulated layer functioning as a conductive channel generated by the semiconductor hetero junction is partially eliminated along the damaged-area locations. This enables the conductive channel to be divided into widths of 0.1 μm or less In this way, a high-performance hetero-junctioned FET can be obtained, which has a conductive channel made up of a highly mobile electron accumulated layer where electrons are one-dimensionally distributed.

In addition, this FET is able to have a conductive channel strip without generating a stepped surface.

In the FET, a plurality of fine ion implanted-area stripes may be provided instead of the fine damaged-area stripes. In this case, the dose is established so that a required P-N junction may be obtained within the layer where no electron accumulated layer is to be generated.

(2) In a second aspect of this invention, a method of manufacturing a FET having conductive channels each some 0.1 μm or less wide is provided. This method enables such a FET as described above to be manufactured at a favorable yield rate.

A method of manufacturing a FET of this aspect comprises the steps of forming a semiconductor hetero junction by first and second semiconductor layers different from each other in electron affinity, forming a plurality of fine damaged-area stripes by selectively damaging desired locations near the interface of the hetero junction within the layer where no electron accumulated layer is to be generated, and forming source and drain electrodes on one of the first and second semiconductor layers.

In a preferred embodiment, the step of forming a plurality of fine damaged-area stripes is realized by forming on a channel area a patterned resist and implanting ions from the resist surface.

The step of forming a plurality of fine damaged-area stripes may be realized by using a focused ion beam.

In the step of implanting ions including in case of using a focused ion beam, the dose is appropriately established so that a required level of damage may be obtained to inhibit the activation of electrons.

In another preferred embodiment, the step of forming a plurality of fine ion implanted-area stripes is provided, instead of the step of forming fine damaged-area stripes. This step is preferably realized by selectively implanting ions into desired locations near the interface of the hetero junction within the layer where no electron accumulated layer is to be generated.

The step of forming a plurality of fine ion implanted-area stripes may be realized by forming on a channel area a patterned resist and implanting ions from the resist surface. This step may also be realized by using a focused ion beam, which advantageously further shortens the manufacturing process.

In case of forming a plurality of fine ion implanted-area stripes, including using a focused ion beam, the dose is established so that a required P-N junction may be obtained within the layer where no electron accumulated layer is to be generated.

(3) In a third aspect of this invention, similar to the first aspect, an FET having conductive channels each 0.1 μm or less wide is provided. This FET of the third aspect has substantially reduced series resistance between the gate and source electrodes.

The FET of the third aspect comprises first and second semiconductor layers formed on a semiconductor substrate, which are different from each other in electron affinity and produce a hetero junction, source and drain electrodes formed on one of the first and second semiconductor layers, a plurality of fine damaged-area stripes formed near the interface of the hetero junction within the first semiconductor layer in the channel area between the source and drain electrodes, a conductive channel of fine electron accumulated area stripes generated at the locations other than those facing the damaged-area stripes near the interface of the hetero junction within the second semiconductor layer, a groove formed in the first semiconductor layer accross the damaged-area stripes which has such a depth as does not reach the electron accumulated area stripes, and a gate electrode formed within the groove.

In this FET, the gate electrode is formed within the groove, so that series resistance between the gate and source electrodes can be substantially reduced.

(4) In a fourth aspect of this invention, a method of manufacturing a FET having conductive channels each 0.1 μm or less wide is provided. This method enables such a FET as described in (3) to be manufactured at a favorable yield rate.

The method of the fourth aspect comprises, in addition to those steps of the method of the second aspect, a step of forming a groove across the damaged-areas of the first semiconductor layer to such a depth as does not reach the electron accumulated layer, and a step of forming a gate electrode within the groove.

Preferably, the step of forming a plurality of fine damaged-area stripes is realized by forming on a channel area a patterned resist and implanting ions from the resist surface, or using a focused ion beam.

The step of forming the groove may be performed by a popular method such as etching.

BRIEF DESCRIPTION OF THE DRAWINGS

FIG. 1 shows a plan of a conventional FET.

FIG. 2 shows a cross section along the II—II line of FIG. 1.

FIG. 3 shows a cross section along the III—III line of FIG. 1.

DESCRIPTION OF THE PREFERRED EMBODIMENTS

Configuration of a FET of a First Embodiment

Figure 4:
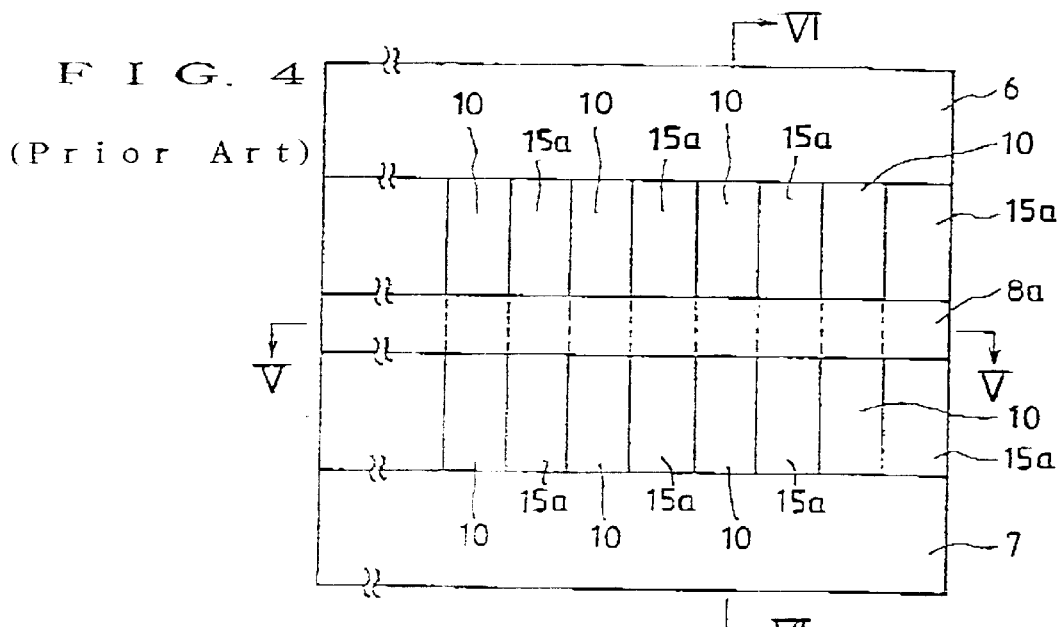
FIG. 4 shows a plan of another conventional FET.
Figure 5:
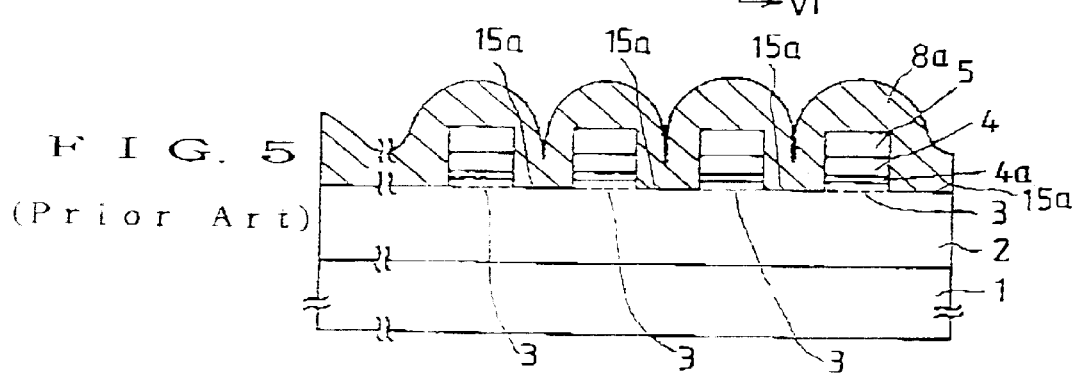
FIG. 5 shows a cross section along the V—V line of FIG. 4.
Figure 6:
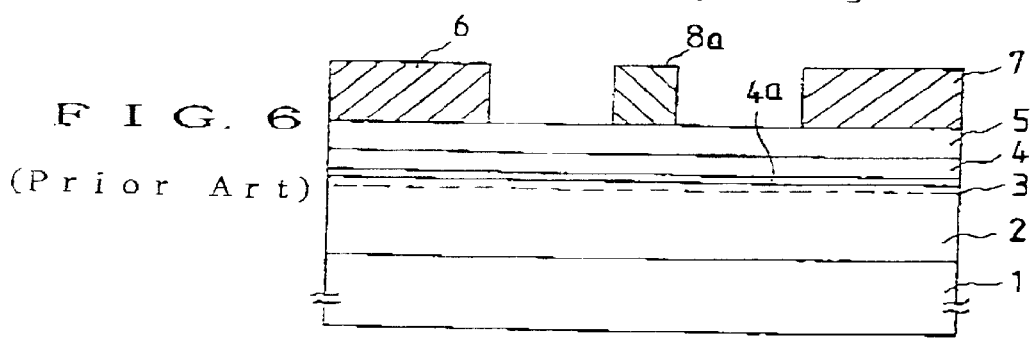
FIG. 6 shows a cross section along the VI—VI line of FIG. 4
Figure 7:
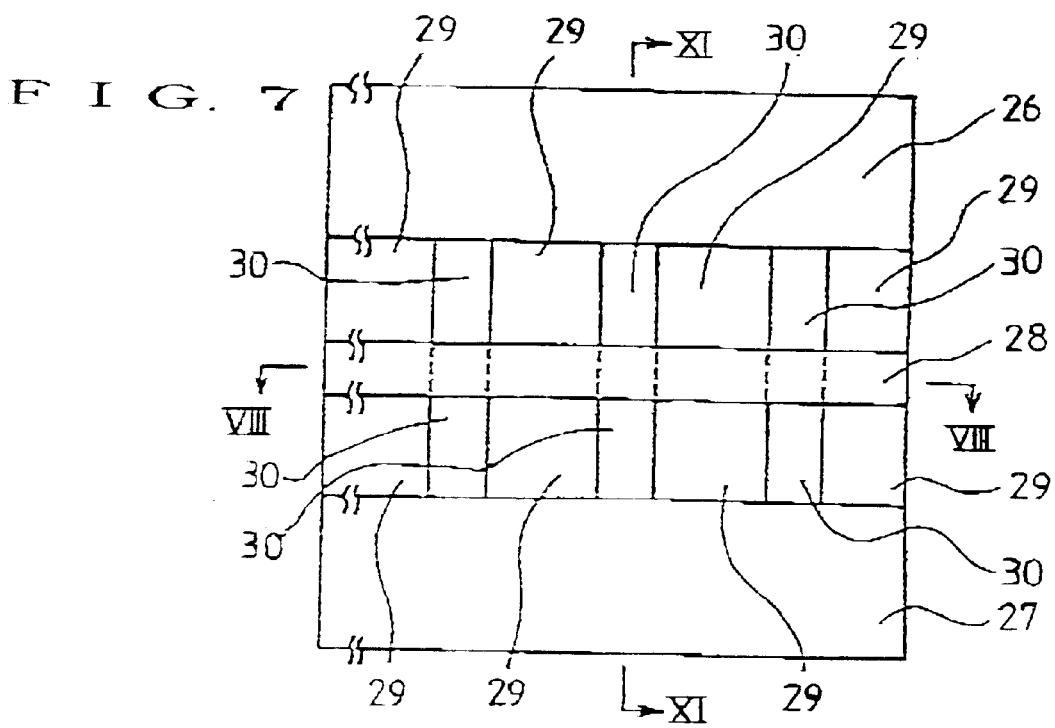
FIG. 7 shows a plan of a FET according to a first embodiment of this invention.
Figure 8:
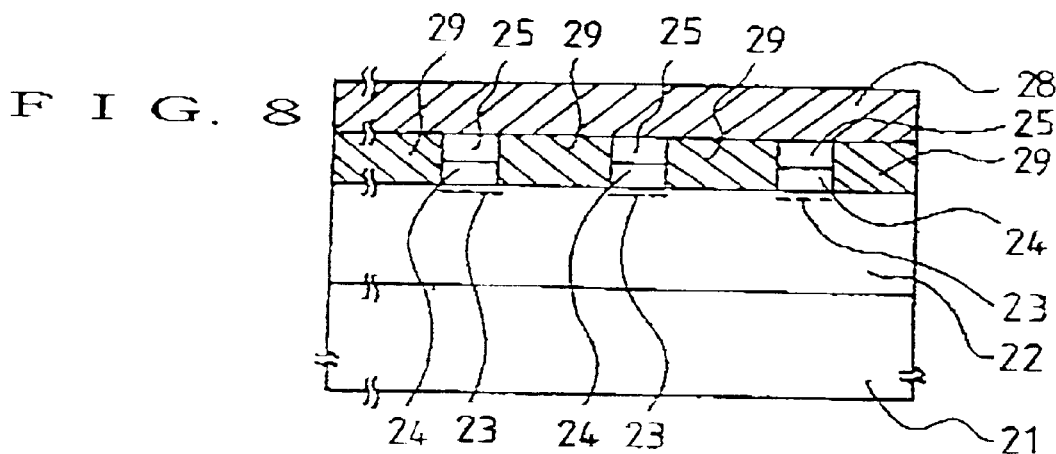
FIG. 8 shows a cross section along the VIII—VIII line of FIG. 7.
Figure 9:
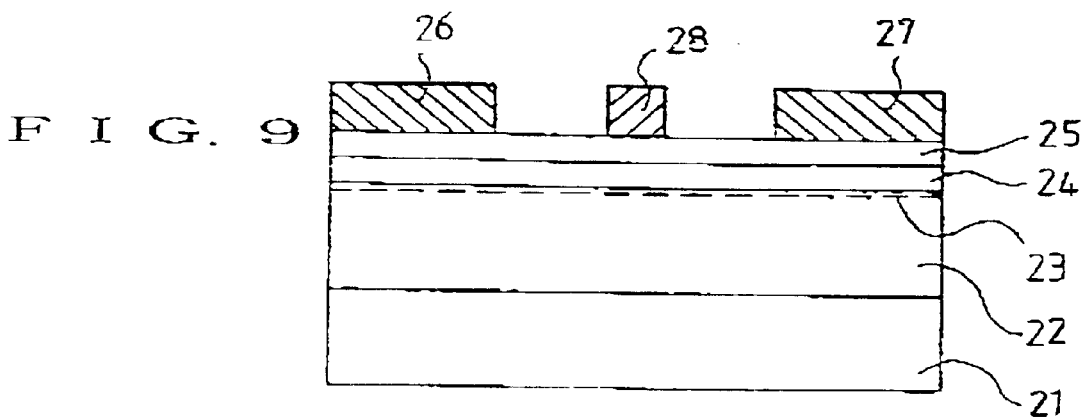
FIG. 9 shows a cross section along the XI—XI line of FIG. 7.

In FIG. 7–FIG. 9, on a primary surface of a semi-insulated GaAs substrate 21 are formed a high-purity GaAs layer 22 (1 $\mu$m in thickness), a N-type $Al_{0.25}Ga_{0.75}As$ layer 24 (20 nm in thickness) doped with $2\times10^{18}$ $cm^{-3}$ Si to supply electrons to an electron accumulated layer 23 generated within the high-purity GaAs layer 22, a N-type GaAs layer 25 (20 nm in thickness) doped with $5\times10^{17}$ $cm^{-3}$ Si in that order. On the surface of the N-type GaAs layer 25, a source electrode 26 and a drain electrode 27 are formed with a channel area therebetween. Within the channel area, a gate electrode 28 is formed almost in the center between the source electrode 26 and the drain electrode 27 on the N-type GaAs layer 25. The aforesaid undoped AlGaAs layer functioning as a spacer in a conventional FET (see FIG. 1–FIG. 6) is not formed.

The source electrode 26 and the drain electrode 27 made of AuGe/Ni form an ohmic contact with the N-type GaAs layer 25. The gate electrode 28 of Al forms a Schottky contact with the N-type GaAs layer.

Within the aforementioned channel area, part of the N-type $Al_{0.25}Ga_{0.75}As$ layer 24 and the N-type layer 25 are damaged and the damaged areas 29 are formed in parallel at a certain interval, as shown in FIG. 8. The damaged areas 29 reach the surface of the high-purity GaAs layer 22. In this way, in the aforementioned channel area, the N-type $Al_{0.25}Ga_{0.75}As$ layer 24 and the N-type GaAs layer 25 are divided into multiple fine strips 30 each 0.1 $\mu$m or less in width. These strips 30 are formed in such a manner as they bridge the source electrode 26 and the drain electrode 27.

Within the high-purity GaAs layer 22, an electron accumulated layer 23 is generated near the interface with the N-type $Al_{0.25}Ga_{0.75}As$ layer 24 as shown in FIGS. 8 and 9. The electron accumulated layer 23 is located only below each of the strips 30 but not below each of the damaged areas 29 The electron accumulated layers 23 constitute a conductive channel of this FET. The voltage applied to the gate electrode 28 modulates the potentials of the N-type GaAs layer 25 and the N-type $Al_{0.25}Ga_{0.75}As$ layer 24 to control the current flowing through the electron accumulated layer 23 between the source electrode 26 and the drain electrode 27.

FET Manufacturing Method of a First Embodiment

Figure 10:
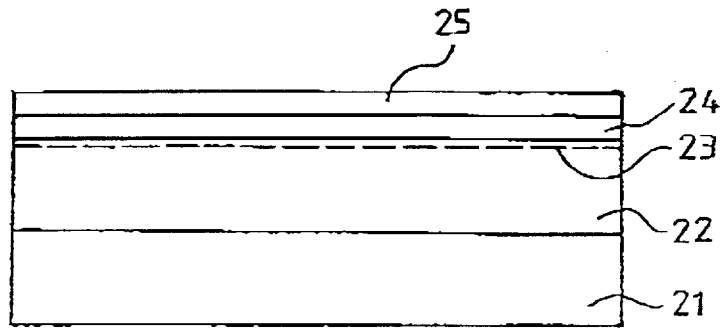
FIG. 10 is a cross section showing a FET manufacturing method according to a first embodiment of this invention.

A FET of the aforementioned first embodiment is manufactured as follows:

First, as shown in FIG. 10, a (undoped) high-purity GaAs layer 22 1 $\mu$m in thickness, a 20 nm-thick N-type $Al_{0.25}Ga_{0.75}As$ layer 24 doped with $2\times10^{18}$ $cm^{-3}$ Si, and a 20 nm-thick N-type GaAs layer 25 doped with $5\times10^{17}$ $cm^{-3}$ Si are grown and formed by an MBE method on a primary surface of a semi-insulated GaAs substrate 21 In this case, in the high-purity GaAs layer 22, an electron accumulated layer 23 with an electron concentration of about $1\times10^{12}$ $cm^{-2}$ is generated near the interface of the hetero junction with the N-type $Al_{0.25}Ga_{0.75}As$ layer 24.

Figure 11:
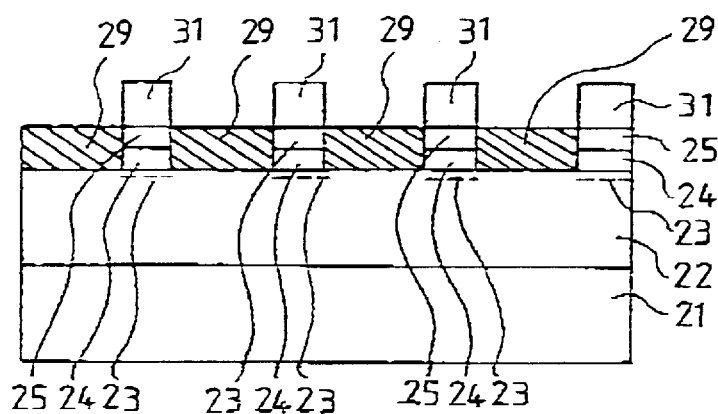
FIG. 11 is a cross section showing a FET manufacturing method according to a first embodiment of this invention.

Next, after an electron beam resist film 31 is formed on the surface of the N-type GaAs layer 25, the resist film 31 is patterned so that strips each 0.1 $\mu$m wide are left, as shown in FIG. 11 on the channel area by an electron beam lithography method Then, with the resist 31 as a mask, $^{11}B^+$ ions are implanted into the N-type $Al_{0.25}Ga_{0.75}As$ layer 24 and the N-type GaAs layer 25. At that time, the conditions are acceleration energy of 5–10 keV. and the amount poured (dose) of $1\times10^{12}$–$1\times10^{13}$ $cm^{-2}$.

Figure 12:
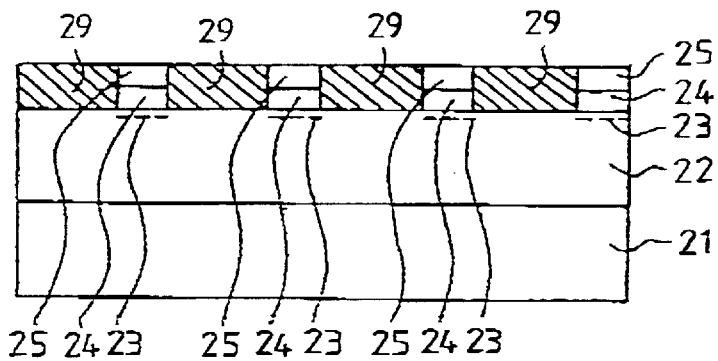
FIG. 12 is a cross section showing a FET manufacturing method according to a first embodiment of this invention.

In the $^{11}B^+$ ion-damaged areas 29 of the N-type GaAs layer 25 and the N-type $Al_{0.25}Ga_{0.75}As$ layer 24, the Si atoms contained no longer activate the electrons within the high-purity GaAs layer 22 As a result, as shown in FIGS. 11 and 12, within the high-purity GaAs layer 22, the electron accumulated layer 23 partially disappears below each of the damaged areas 29 and becomes present only below the locations other than those of the damaged areas 29 This makes the distribution of electrons in the conductive channel considerably one-dimensional for possible improvement of transport characteristics including electron mobility.

Here, the $^{11}B^+$ ions used may be replaced by $^{16}O^+$ ions which, remaining inert if heat-treated, are capable of damaging crystals or neutral $^{41}Ar^+$ ions.

After ion implantation, the resist 31 is removed. The state at that time is shown in FIG. 12.

This is followed by the formation using an electron beam lithography and a lift-off method, of a gate electrode 28 with a gate length of 0.1 $\mu$m as well as a source electrode 26 and a drain electrode 27 both 0.2 $\mu$m apart from the gate electrode 28 in a sidewise direction opposite to each other formed on the surface of the N-type GaAs layer 25. In this way, a FET of the configuration shown in FIG. 7–FIG. 9 is obtained.

Using an FET manufactured as above so that the width of its conductive channel as a whole was 15 $\mu$m, consisting of 150 parallel strips each 0.1 $\mu$m wide, a cut-off frequency of 50 GHz was experimentally obtained. This exceeds 40 GHz or so of a FET whose conductive channel is divided by the use of conventional mesas (see FIG. 1–FIG. 3). It was also found that the yield rate at which a conductive channel and a gate electrode 28 are formed can be remarkably improved.

Instead of the electron beam resist 31 which is used in the above method as a mask for selective implantation of $^{11}B^+$ ions into the N-type GaAs layer 25 and the N-type $Al_{0.25}Ga_{0.75}As$ layer 26, a focused ion beam (FIB) was used to directly implant $^{11}B^+$ ions into the areas to be damaged for the similar manufacture of a FET. In such case as well, almost the same characteristics as in the case with the resist 31 could be obtained. Furthermore, at that time, the entire manufacturing process was shortened as it required no photolithography process to form the resist 31.

As mentioned so far, the FET that can be obtained in the above first embodiment is provided with a conductive channel divided into strips each 0.1 μm or less wide as semiconductor crystals (N-type GaAs layer 25 and N-type $Al_{0.25}Ga_{0.75}As$ layer 24) are selectively damaged in the channel area between the source and drain electrodes of the hetero-junctioned FET to prevent electron activation due to the impurity atoms (Si) with which the area has been doped, thereby selectively eliminating the electron accumulated layer functioning as a conductive channel.

In addition, the above method enables a FET having a conductive channel divided into 0.1 μm or less widths to be manufactured at a favorable yield rate due to the fact that the maintained flatness of the channel area surface never reduces the yield rate at which a gate is formed.

Therefore, according to the above first embodiment, a high-performance hetero-junctioned FET, in which a highly mobile electron accumulated layer where electrons are one-dimensionally distributed is used as a conductive channel, can be effectively manufactured at a high yield rate.

Configuration of a FET of a Second Embodiment

Figure 13:
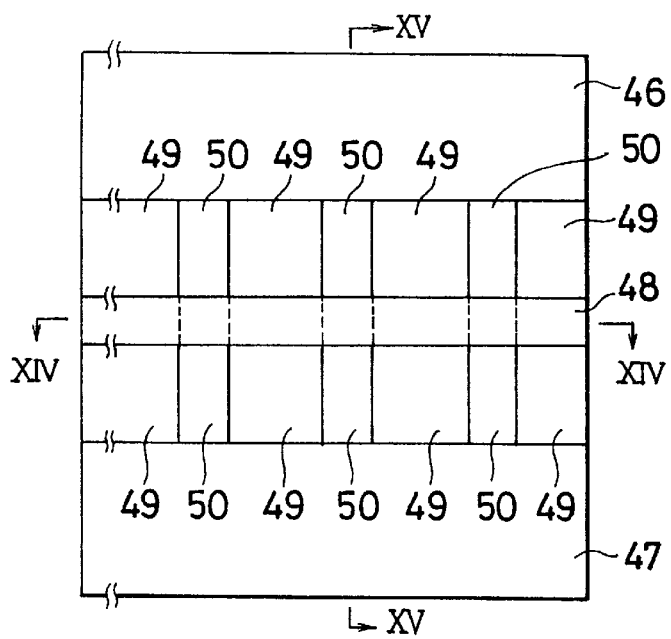
FIG. 13 shows a plan of a FET according to a second embodiment of this invention.
Figure 14:
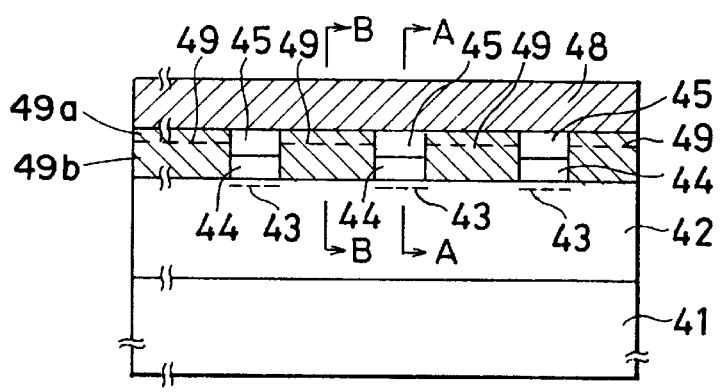
FIG. 14 shows a cross section along the XIV—XIV line of FIG. 13.
Figure 15:
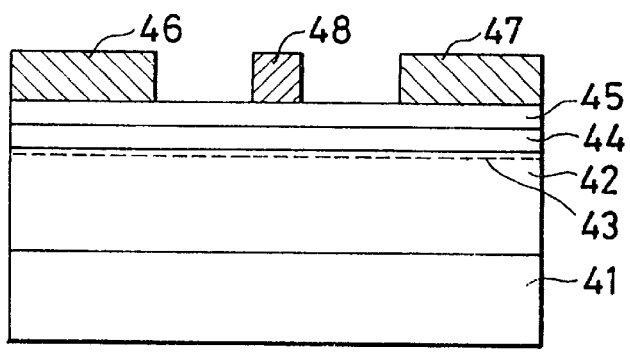
FIG. 15 shows a cross section along the XV—XV line of FIG. 13.

FIG. 13–FIG. 15 show a configuration of a FET of a second embodiment of this invention.

In FIG. 13–FIG. 15, like in a first embodiment, on a primary surface of a semi-insulated GaAs substrate 41 are formed a high-purity GaAs layer 42 (1 μm in thickness), a N-type $Al_{0.25}Ga_{0.75}As$ layer 44 (20 nm in thickness) doped with $2\times10^{18}$ $cm^{-3}$ of N-type impurity Si to supply electrons to an electron accumulated layer 43 generated within the high-purity GaAs layer 42, and an N-type GaAs layer 45 (20 nm in thickness) doped with $5\times10^{17}$ $cm^{-3}$ Si in that order. On the surface of the N-type GaAs layer 45, a source electrode 46 and a drain electrode 47 are formed with a channel area therebetween. Within the channel area, a gate electrode 48 is formed almost in the center between the source electrode 46 and the drain electrode 47 on the N-type GaAs layer 45. The aforementioned undoped AlGaAs layer which functions as a spacer in a conventional FET (see FIG. 1–FIG. 6) has not been formed.

The source electrode 46 and the drain electrode 47 both made of AuGe/Ni form an ohmic contact with the N-type GaAs layer 45. The gate electrode 48 made of Al form a Schottky contact with the N-type GaAs layer 45.

In the aforementioned channel area, $^9Be^+$ ions have been implanted into part of the N-type $Al_{0.25}Ga_{0.75}As$ layer 44 and the N-type GaAs layer 45, and the ion-implanted areas 49 are formed in parallel at a certain interval, as shown in FIG. 14. The ion-implanted areas 49 are schematically illustrated to reach the surface of the high-purity GaAs layer 42 in FIG. 14, in addition to being implanted in the aforesaid layers 44 and 45. The top portions of the ion-implanted areas 49 are converted from an n-type to a p-type region 49a, while the lower portions 49b, even with the implantation of $Be^+$ ions, maintain an n-type nature since the population of positive ions in this region does not exceed the preexisting population of n-type dopants. The line between the upper and lower regions 49a, 49b is a P-N junction, also shown in FIG. 20. In this way, in the aforesaid channel area, the N-type $Al_{0.25}Ga_{0.75}As$ layer 44 and the N-type GaAs layer 45 have been, divided into multiple fine strips 50 each 0.1 μm or less in width. These strips 50 bridge the source electrode 46 and the drain electrode 47.

Within the high-purity GaAs layer 42, as shown in FIGS. 14 and 15, an electron accumulated layer 43 which constitutes a conductive channel of this FET is generated near the interface with the N-type $Al_{0.25}Ga_{0.75}As$ layer 44. The electron accumulated layer 43 is located only below each of the strips 50 but not below each of the ion-implanted areas 49 The voltage applied to the gate electrode 48 modulates the potentials of the N-type GaAs layer 45 and the N-type $Al_{0.25}Ga_{0.75}As$ layer 44 to control the current flowing through the electron accumulated layer 43 between the source electrode 46 and the drain electrode 47.

Figure 19:
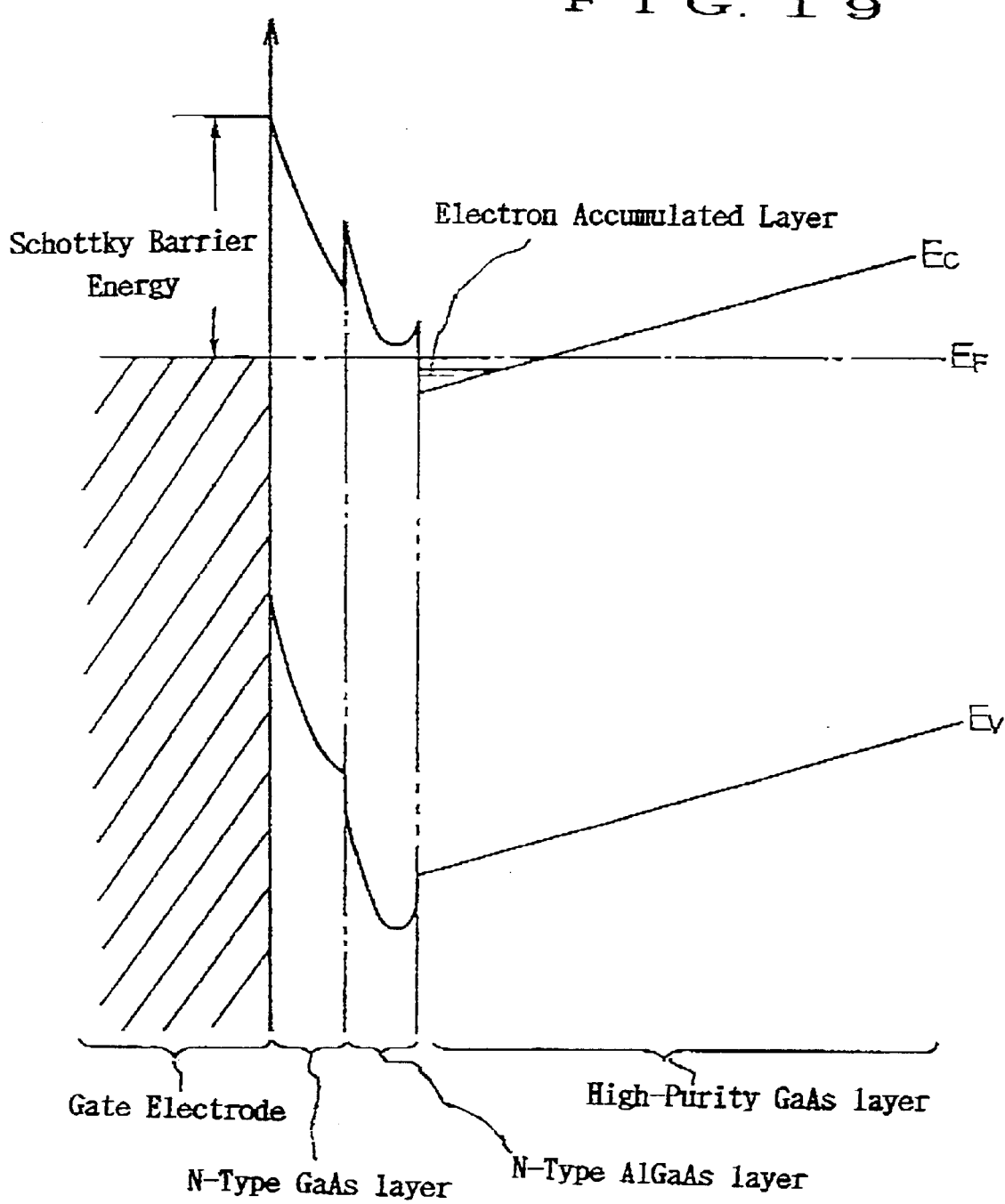
FIG. 19 cross-sectionally shows an energy band along the A—A line of FIG. 14.

An energy band in a semiconductor cross section along the A—A line in FIG. 14 of the areas into which no $Be^+$ ions are implanted is illustrated in FIG. 19. FIG. 19 shows that the electron accumulated layers 43 which become a conductive channel have been formed near the interface of the high-purity GaAs layer 42 and the n-type AlGaAs layer 44 within the high-purity GaAs layer 42.

Figure 20:
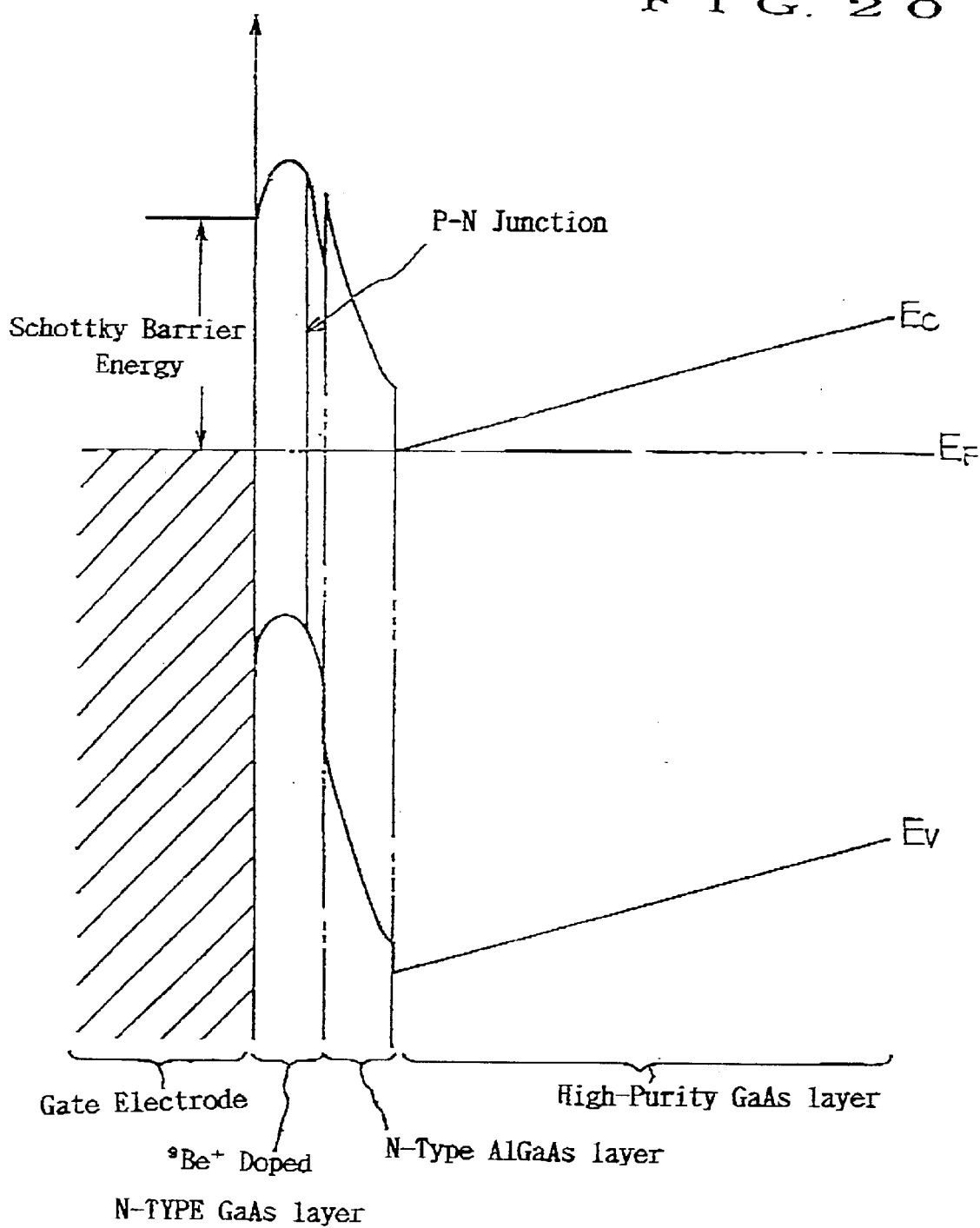
FIG. 20 cross-sectionally shows an energy band along the B—B line of FIG. 14.

On the other hand, an energy band in a semiconductor cross section along the B—B line in FIG. 14 of the ion-implanted areas 49 is illustrated in FIG. 20. FIG. 20 shows that, at the interface of the N-type $Al_{0.25}Ga_{0.75}As$ layer 44 and the high-purity GaAs layer 42, the energy Ec at the bottom of a conductive band is larger than Fermi energy Ef, indicating the disappearance of the electron accumulated layer. More specifically, the upper part of the GaAs layer 45 into which $^9Be^+$ ions (a p-type dopant) are implanted to be higher in dopant concentration the n-type dopat that have already been doped into the GaAs layer 45 becomes of a P-type nature to form a P-N junction there, thereby pushing up the profile of the energy band. This results in the energy Ec at the bottom of the conductive band being larger than Fermi energy Ef.

Manufacturing Method in a Second Embodiment

Figure 16:
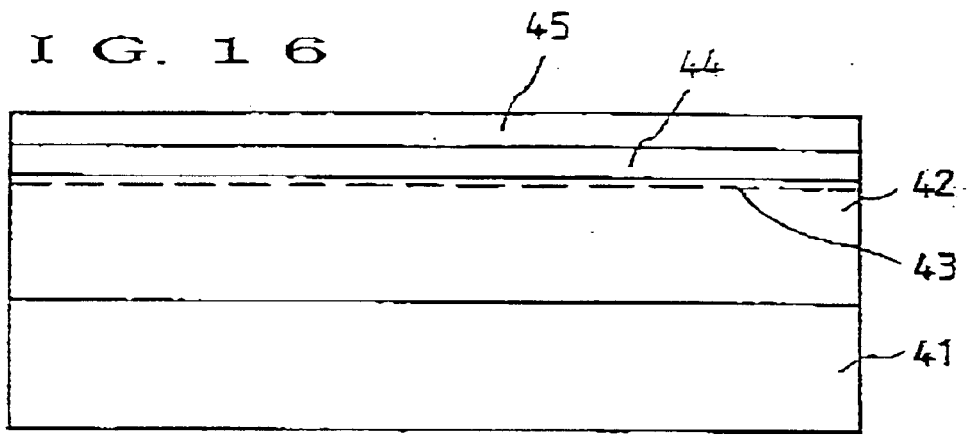
FIG. 16 is a cross section showing a FET manufacturing method according to a second embodiment of this invention.

A FET in the aforementioned second embodiment is manufactured as follows:

First, as shown in FIG. 16, an undoped (high-purity) GaAs layer 42 1 μm in thickness, a 20 nm-thick N-type $Al_{0.25}Ga_{0.75}As$ layer 44, and a 20 nm-thick N-type GaAs layer 45 are grown and formed in that order by an MBE method on a semi-insulated GaAs substrate 41. In such cases, within the high-purity GaAs layer 42, an electron accumulated layer 43 with an electron concentration of about $1\times10^{12}$ $cm^{-2}$ is formed near the interface of the hetero junction with the N-type AlGaAs layer 44 different from the high-purity GaAs layer 42 in electron affinity.

Figure 17:
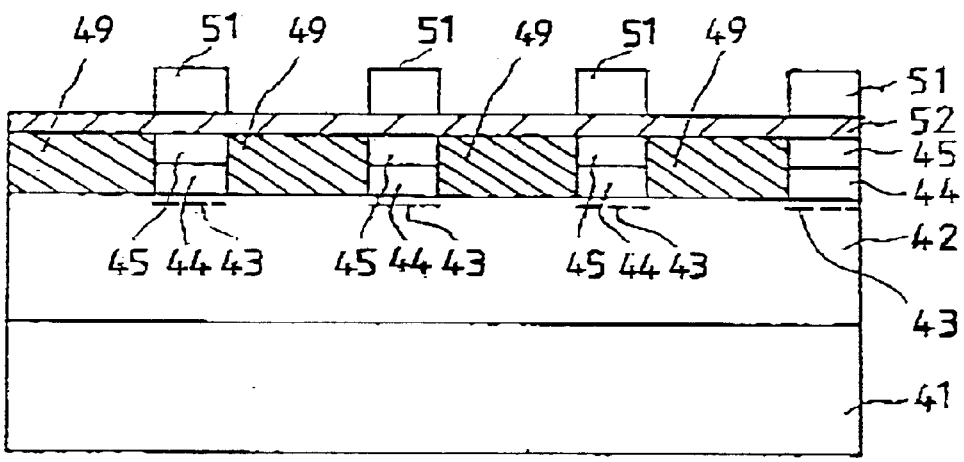
FIG. 17 is a cross section showing a FET manufacturing method according to a second embodiment of this invention.

Next, after a $SiO_2$ film 52 100 nm in thickness is grown on the N-type GaAs layer 45 by a plasma CVD method at 400° C., an electron beam resist film 51 is formed on the $SiO_2$ film 52. The resist 51 is patterned by an EB (electron beam) direct imaging method to leave resist strips each about 1 μm wide on the channel area, as shown in FIG. 17.

Then, with the resist 51 as a mask, $^9Be^+$ ions are implanted through the $SiO_2$ film 52 into the N-type $Al_{0.25}Ga_{0.75}As$ layer 44 and the N-type GaAs layer 45 by the amount (dose) of $1\times10^{14}$ $cm^{-2}$ at an acceleration energy of 10 keV for subsequent annealing for 5 seconds at the atmosphere of AsH3.

Figure 18:
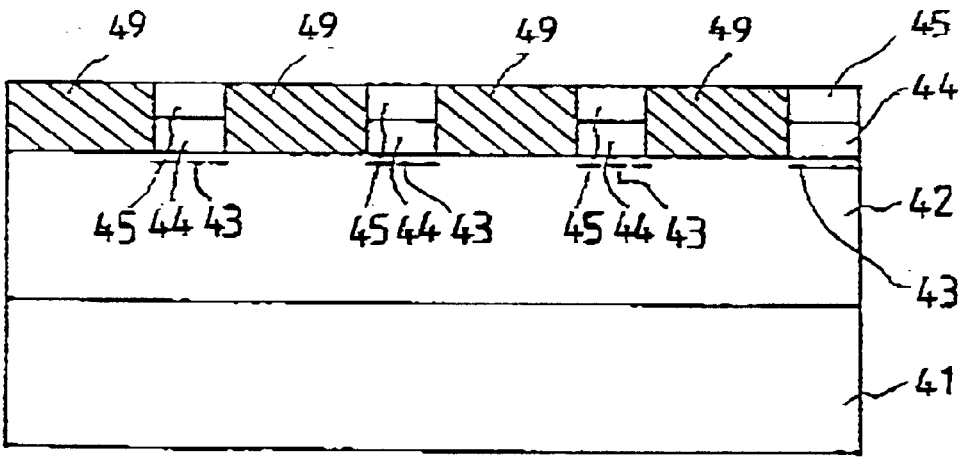
FIG. 18 is a cross section showing a FET manufacturing method according to a second embodiment of this invention.

This is followed by the removal of the $SiO_2$ film 52 and the resist 51. The state at that time is shown in FIG. 18 Subsequently, an electron beam resist (unillustrated), after formed on the N-type GaAs layer 45, is patterned by an EB direct imaging method and then covered with a metal film so that a gate electrode 48, a source electrode 46, and a drain electrode 47 may be formed by a lift-off method As a result, a gate electrode 48 with a gatelength of 0.1 μm is formed together with a source electrode 46 and a drain electrode 47 each arranged 0.2 μm apart from the gate electrode 48 In this way, a FET of the configuration shown in FIG. 13–FIG. 15 can be obtained.

Using an FET manufactured as above so that the width of its conductive channel as a whole is 15 μm, consisting of 150 parallel strips each 0.1 μm wide, a cut-off frequency of 52 GHz was experimentally obtained This exceeds 40 GHz obtained by a FET whose conductive channel is divided through the formation of conventional mesas (see FIG. 1–FIG. 3). It was also found that the yield rate at which a conductive channel and a gate electrode 48 are formed can be remarkably improved.

Instead of the electron beam resist 51 which was used in the above process as a mask for selective implantation of $^9Be^+$ ions, a focused ion beam (FIB) was used to directly implant $^9Be^+$ ions into the areas desired to be done for the similar manufacture of an FET. In such cases as well, almost the same characteristics could be obtained. Furthermore, at that time, the entire manufacturing process was shortened as it required no photolithography process to form the resist 51.

As mentioned so far, in the FET that can be obtained in the aforementioned second embodiment, P-type dopants are selective implanted into the N-type semiconductor crystals (N-type GaAs layer 45 and N-type $Al_{0.25}Ga_{0.75}As$ layer 44) in the channel area between the source and drain electrodes to form a P-N junction near the aforementioned semiconductor crystal surface so that the energy at the bottom end of the conductive band in the aforesaid semiconductor crystals should be larger than the Fermi energy. Thus, such selective elimination of the electron accumulated layer which, as a conductive channel, appears near the interface of the semiconductor hetero junction, realizes the manufacture of a FET having a conductive channel divided into strips each 0.1 μm or less wide.

In addition, the above method enables an FET having a conductive channel divided into 0.1 μm or less widths to be manufactured at a favorable yield rate as no stepped surface is produced in the channel area to reduce the yield rate at which a gate is formed.

Therefore, according to the above first embodiment, a high-performance hetero-junctioned FET, in which a highly mobile electron accumulated layer where electrons are one-dimensionally distributed is used as a conductive channel, can be effectively manufactured at a high yield rate.

Configuration of a FET of a Third Embodiment

Figure 21:
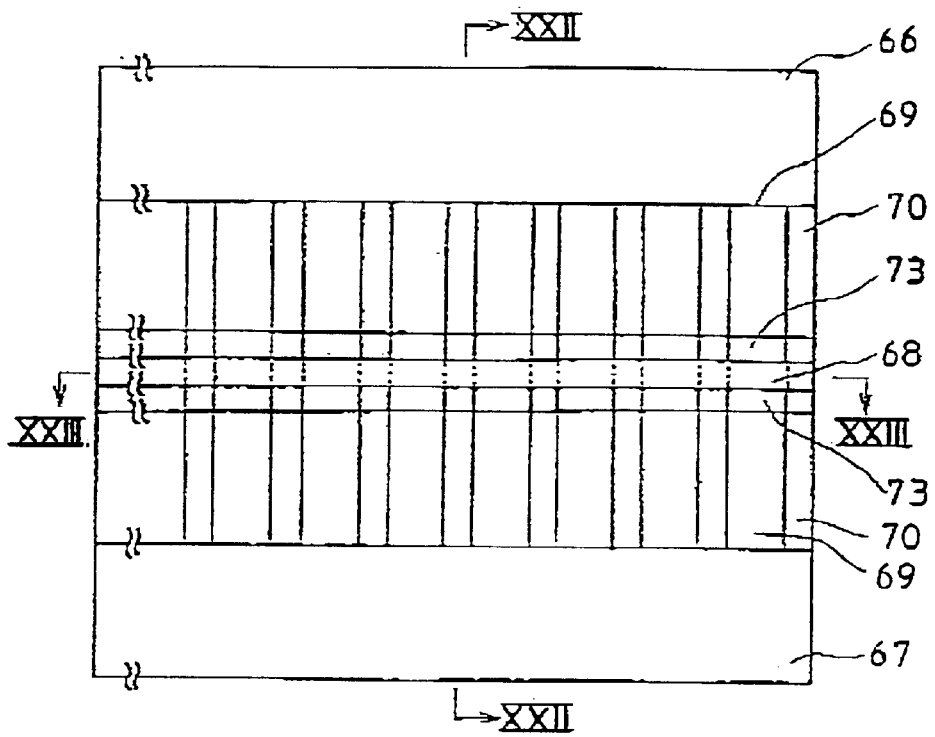
FIG. 21 shows a plan of a FET according to a third embodiment of this invention.
Figure 22:
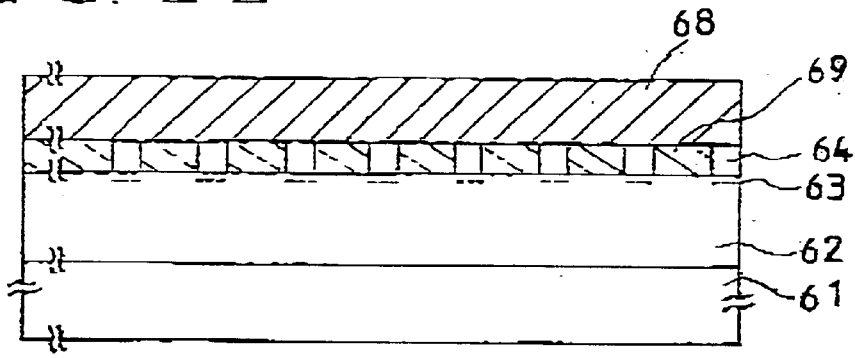
FIG. 22 shows a cross section along the XXII—XXII line of FIG. 21.
Figure 23:
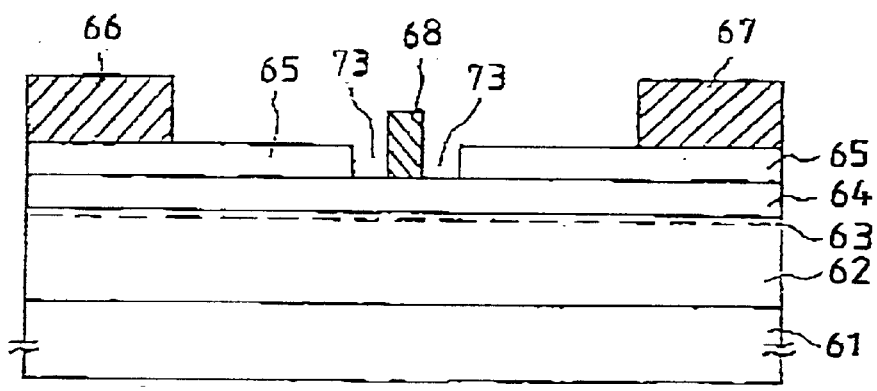
FIG. 23 shows a cross section along the XXIII—XXIII line of FIG. 21.

FIG. 21–FIG. 23 show a configuration of a FET of a third embodiment of this invention.

In FIG. 21–FIG. 23, on a primary surface of a semi-insulated GaAs substrate 61 are formed a high-purity GaAs layer 62 (1 μm thickness), a N-type $Al_{0.25}Ga_{0.75}As$ layer 64 (40 nm in thickness) doped with $2 \times 10^{18}$ cm$^{-3}$ Si to supply electrons to an electron accumulated layer 63 generated within the high-purity GaAs layer 62, and a N-type GaAs layer 65 (40 nm in thickness) doped with $5 \times 10^{18}$ cm$^{-3}$ Si in that order. On the surface of the N-type GaAs layer 65, a source electrode 66 and a drain electrode 67 are formed with a channel area therebetween. Almost in the center between the source electrode 66 and the drain electrode 67 in the channel area is formed a groove 73 called a recess within which a gate electrode 68 is formed. The depth of the groove 73 is nearly the same as the thickness of the N-type GaAs layer 65 and the N-type $Al_{0.25}Ga_{0.75}As$ layer 64 is exposed at the bottom of the groove 73. The aforementioned undoped AlGaAs layer functioning as a spacer for a conventional PET (see FIG. 1–FIG. 6) is not formed.

The source electrode 66 and the drain electrode 67 both made of AuGe/Ni form an ohmic contact with the N-type GaAs layer 65. The gate electrode 68 of Al forms a Schottky contact with the N-type $Al_{0.25}Ga_{0.75}As$ layer 64.

In the above-mentioned channel area, part of the N-type $Al_{0.25}Ga_{0.75}As$ layer 64 and the N-type GaAs layer 65 is damaged, and the damaged areas 69 are formed in parallel at a certain interval. as shown in FIG. 22. The damaged areas 69 reach the surface of the high-purity layer 62. Within the grooves 73, the damaged areas 69 are formed only in the N-type $Al_{0.25}Ga_{0.75}As$ layer 64 as no N-type GaAs layer 65 exists (see FIG. 23). Thus, in the aforementioned channel area, the N-type $Al_{0.25}Ga_{0.75}As$ layer 24 and the N-type GaAs layer 25 are divided into multiple fine strips 70 each 0.1–1 μm wide. These strips 70 are formed in such a manner as they bridge the source electrode 66 and the drain electrode 67. This is roughly the same as in the case of the first embodiment.

Within the high-purity GaAs layer 62, as shown in FIGS. 22 and 23, an electron accumulated layer 63 is formed near the interface with the N-type $Al_{0.25}Ga_{0.75}As$ layer 64. The electron accumulated layer 63 is present only below each of the strips 70 but not below each of the damaged areas 69. The electron accumulated layer 63 constitute a conductive channel of this FET. The voltage applied to the gate electrode 68 modulates the potential (electron concentration) of the N-type $Al_{0.25}Ga_{0.75}As$ layer 64 to control the current flowing through the electron accumulated layer 63 between the source electrode 66 and the drain electrode 67.

Manufacturing Method of a Third Embodiment

Figure 24:
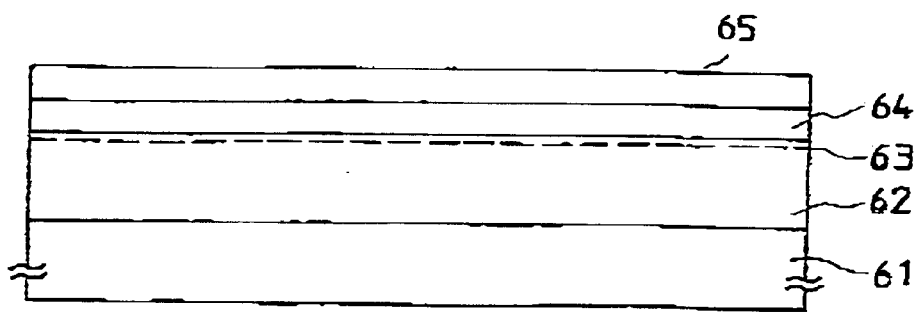
FIG. 24 is a cross section showing a FET manufacturing method according to a third embodiment of this invention.
Figure 25:
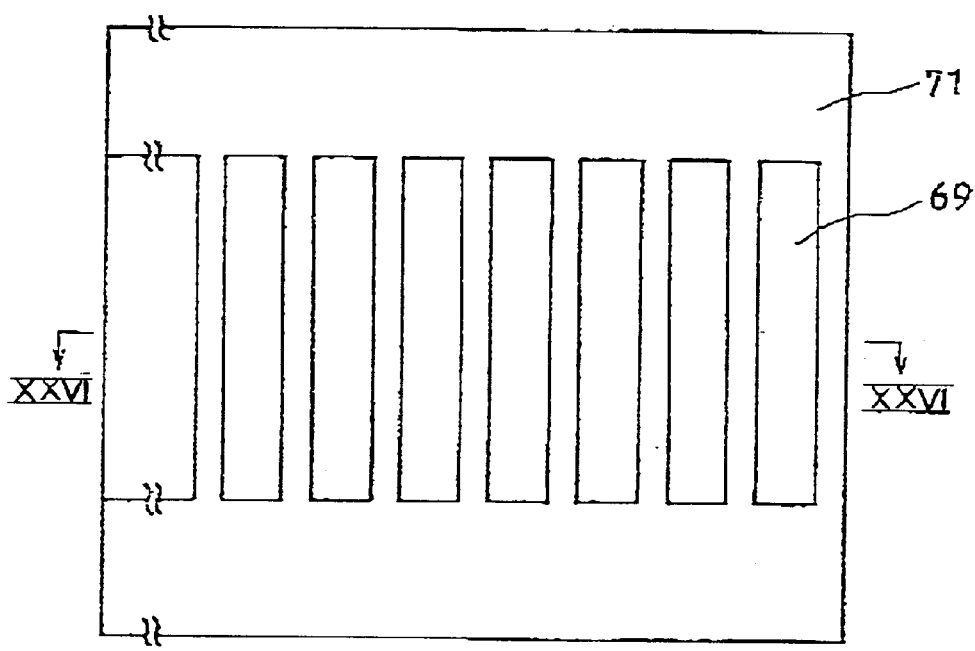
FIG. 25 is a cross section showing a FET manufacturing method according to a third embodiment of this invention.

A FET in the aforementioned third embodiment is manufactured as follows:

First, as shown in FIG. 24, a (undoped) high-purity GaAs layer 62 1 μm in thickness, a 40 nm-thick N-type $Al_{0.25}Ga_{0.75}As$ layer 64 doped with $2 \times 10^{18}$ cm$^{-3}$ Si, and a 40 nm-thick N-type GaAs layer 65 doped with $5 \times 10^{18}$ cm$^{-3}$ Si are grown and formed by an MBE method on a primary surface of a semi-insulated GaAs substrate 61. In such case, within the high-purity GaAs layer 62, an electron accumulated layer 63 with an electron concentration of about $1 \times 10^{12}$ cm$^{-2}$ is generated near the hetero junction interface with the N-type $Al_{0.25}Ga_{0.75}As$ layer 64 and the high-purity GaAs layer 62.

Next, an electron beam resist film 71, after being formed on the surface of the N-type GaAs layer 65, is patterned by a high-resolution electron beam lithography method to leave the resist 71 on the channel area in strips each 1 μm wide. Subsequently, with the resist 71 as a mask, $^{11}B^+$ ions are implanted into the N-type $Al_{0.25}Ga_{0.75}As$ layer 64 and the N-type GaAs layer 65. The conditions at that time are an acceleration energy of 30 keV and the amount poured (dose) of $1 \times 10^{13}$ cm$^{-2}$. This acceleration energy is much larger than that in the aforementioned first embodiment. Hence, the locations uncovered with the resist 71 of the N-type $Al_{0.25}Ga_{0.75}As$ layer 64 and the N-type GaAs layer 65 are damaged by. the $^{11}B^+$ ions, resulting in the formation of damaged areas 69 having a flat rectangular plan shape in the N-type $Al_{0.25}Ga_{0.75}As$ layer 64 and the N-type GaAs layer 65.

Figure 26:
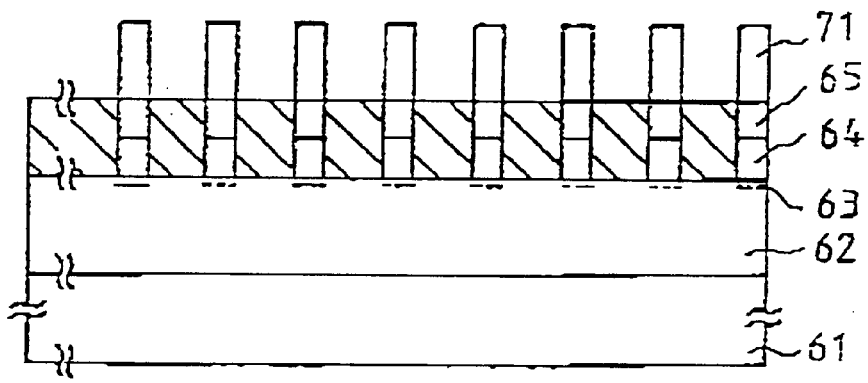
FIG. 26 is a cross section showing a FET manufacturing method according to a third embodiment of this invention.

In the damaged areas 69, the Si atoms contained no longer activate electrons within the high-purity GaAs layer 62. As a result, as shown in FIG. 26, the electron accumulated layer 63 disappears below the damaged areas 69 within the high-purity GaAs layer 62. This makes the electron distribution in the conductive channel considerably one-dimensional for possible improvement of transport characteristics including electron mobility.

Here, the $^{11}B^+$ ions used may be replaced by neutral atoms such as $^{16}O^+$, $^{40}Ar^+$, and $^{20}Ne^+$ ions.

Figure 27:
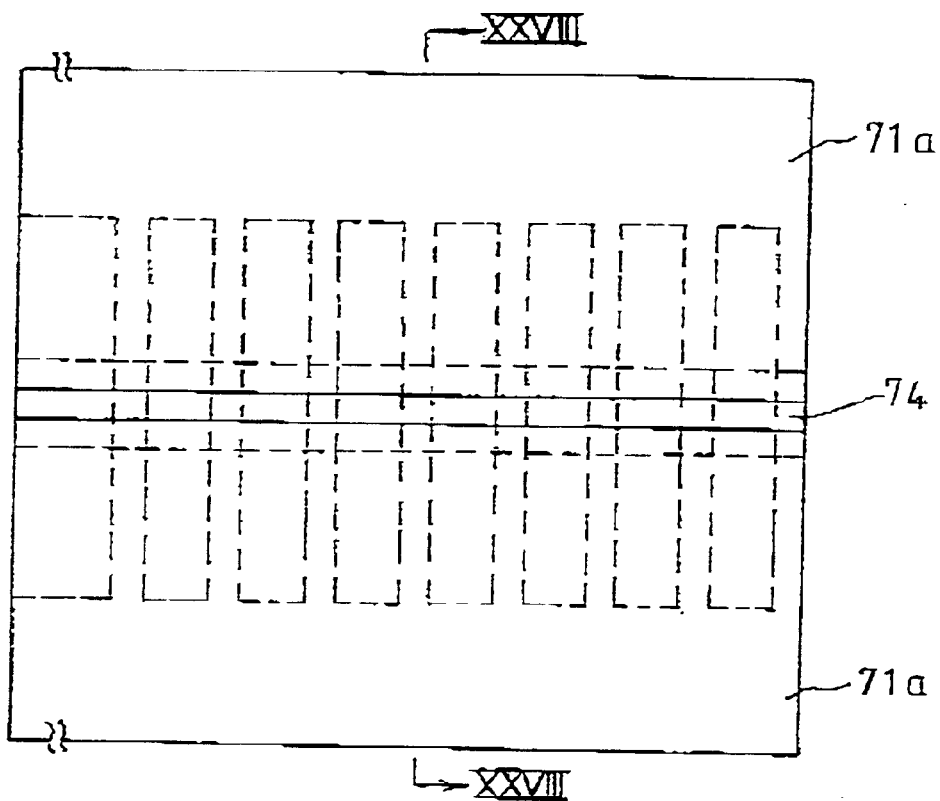
FIG. 27 is a cross section showing a FET manufacturing method according to a third embodiment of this invention.
Figure 28:
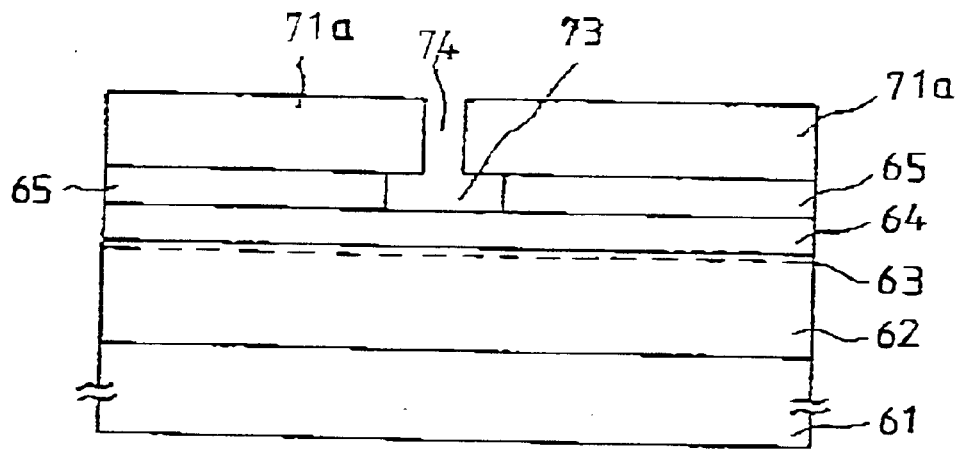
FIG. 28 is a cross section showing a FET manufacturing method according to a third embodiment of this invention.

At the end of the implantation of ions, an electron beam resist 71a is recoated on the N-type GaAs layer 65 after the aforesaid resist 71 is removed. The electron resist 71a is patterned by a high-resolution electron beam lithography method so that openings each about 0.1 μm wide are formed on the resist 71a, as shown in FIGS. 27 and 28.

Then, a liquid mixture of H2SO4, H2O2, and H2O is used to etch the N-type GaAs layer 65 below the openings 74 on the resist 71a with the least damage. This resulted in the formation of grooves (recesses) 73 as shown in FIGS. 27 and 28.

This is followed by the formation of a gate electrode 68 as shown in FIG. 21–FIG. 23 by lifting off the electron beam resist 71a, after the formation by vacuum evaporation of an Al film 300 nm in thickness, to remove an unnecessary part of the Al film.

Furthermore, a resist (unillustrated), after being coated on the N-type $Al_{0.25}Ga_{0.75}As$ layer 64 and the N-type GaAs layer 65, is patterned to form open spaces each 0.5 μm apart from the gate electrode 68. A source electrode 66 and a drain electrode 67 as shown in FIG. 21–FIG. 23 are formed by depositing an AuGe/Ni film on the resist and then removing an unnecessary part of the AuGe/Ni film by a lift-off method. Finally, this is subjected to heat-treatment at 400° C. in the atmosphere of $H_2$ to obtain an FET of the aforementioned configuration.

Using a FET manufactured as above so that the width of its conductive channel, as a whole is 15 μm, consisting of 150 parallel strips each 0.1 μm wide, a cut-off frequency of an improved 70 GHz as compared with a conventional 40 GHz could be experimentally obtained The series resistance Rs between the gate electrode 68. and the source electrode 66 could also be reduced from 1 Ωmm to 0.4 Ωmm. Furthermore, the yield rate at which the conductive channel areas and a gate electrode are formed was remarkably improved.

Instead of the electron beam resist 71 which was used in the above process as a mask for selective implantation of $^{11}B^+$ ions, a focused ion beam (FIB) method was used to directly implant $^{11}B^+$ ions without using a resist for the manufacture of a FET in which damaged areas similar to those mentioned above are formed. In such cases as well, almost the same characteristics as in the case with the resist 71 were obtained and the entire manufacturing process could also be shortened.

As mentioned so far, the FET that can be obtained in the above third embodiment is provided, like the first embodiment, with a conductive channel divided into fine strips each 0.1 μm or less wide by selectively damaging an electron accumulated layer which constitutes a conductive channel. In addition, the provided high-concentration N-type GaAs layer and recess structure enable the series resistance between the gate and source electrodes to be substantially reduced.

Although the above explanation relates to a FET using a hetero junction between a N-type AlGaAs layer and a high-purity GaAs layer, this invention may also apply to a FET which uses another type of hetero junction such as between a AlInAs and an GaInAs layer or between an AlGaAs and an InGaAs layer.

What is claimed is:

1. A field effect transistor comprising:
   a first semiconductor layer and a second semiconductor layer, a N-type AlGaAs layer of the first semiconductor layer and a high purity GaAs sublayer of the second semiconductor layer being different from each other in electron affinity and producing a hetero junction, wherein said first semiconductor layer includes said N-type AlGaAs sublayer and a N-type GaAs sublayer;
   a gate electrode, a source electrode and a drain electrode formed on said first semiconductor layer and said second semiconductor layer;
   a plurality of fine damaged-area stripes comprising neutral ions and formed within said first semiconductor layer near the interface of said hetero junction in the channel area between said source electrode and said drain electrode; and
   a conductive channel of fine electron accumulated area stripes within said second semiconductor layer generated at locations other than those facing said plurality of damaged-area stripes near the interface of said hetero junction.

2. A field effect transistor comprising:
   a first semiconductor layer and a second semiconductor layer, a N-type $Al_{0.25}Ga_{0.75}As$ sublayer of the first semiconductor layer and a high purity GaAs layer of the second semiconductor layer being different from each other in electron affinity and producing a hetero junction, wherein said first semiconductor layer includes said N-type $Al_{0.25}Ga_{0.75}As$ sublayer and a N-type GaAs sublayer;
   a source electrode and a drain electrode formed on said first semiconductor layer;
   a plurality of fine damaged-area stripes comprising neutral ions and formed within said first semiconductor layer near the interface of said hetero junction in the channel area between said source electrode and said drain electrode; and
   a conductive channel of fine electron accumulated area stripes within said second semiconductor layer generated at locations other than those facing said plurality of damaged-area stripes near the interface of said hetero junction.

3. A field effect transistor comprising:
   a first semiconductor layer and a second semiconductor layer formed on a semiconductor substrate, a N-type $Al_{0.25}Ga_{0.75}As$ sublayer of the first semiconductor layer and a high purity GaAs layer of the second semiconductor layer being different from each other in electron affinity and producing a hetero junction, wherein said first semiconductor layer includes said N-type $Al_{0.25}Ga_{0.75}As$ layer and a N-type GaAs layer;
   a source electrode and a drain electrode formed on said first semiconductor layer;
   a plurality of fine ion implanted-area stripes formed within said first semiconductor layer near the interface of said hetero junction in the channel area between said source electrode and said drain electrode; and
   a conductive channel of fine electron accumulated area stripes within said second semiconductor layer generated at locations other than those facing said plurality of fine ion implanted-area stripes near the interface of said hetero junction.

4. A field effect transistor comprising:

a first semiconductor layer and a second semiconductor layer formed on a semiconductor substrate, a AlGaAs sublayer of said first semiconductor layer and a GaAs layer of said second semiconductor layer being different from each other in electron affinity, thereby producing a hetero junction;

a source electrode and a drain electrode formed on said first semiconductor layer;

a plurality of fine damaged-area stripes formed within said first semiconductor layer near the interface of said hetero junction in the channel area between said source electrode and said drain electrode;

a conductive channel of fine electron accumulated area stripes within said second semiconductor layer generated at locations other than those facing said plurality of damaged-area stripes near the interface of said hetero junction;

a groove formed in said first semiconductor layer across said plurality of damaged-area stripes, said groove having a depth that does not reach said electron accumulated area stripes; and a gate electrode formed within said groove.

5. A field effect transistor as claimed in claim 4, wherein said first semiconductor layer includes at least two sublayers.

6. A field effect transistor as claimed in claim 5, wherein said first semiconductor layer includes a N-type $Al_{0.25}Ga_{0.75}As$ sublayer and a N-type GaAs sublayer and said second semiconductor layer includes a high-purity GaAs layer.

7. A field effect transistor comprising:

a first semiconductor layer of a first conductivity type and a second semiconductor layer formed on a semiconductor substrate, the first semiconductor layer and the second semiconductor layer being different from each other in electron affinity and producing a hetero junction, and the first semiconductor layer being doped with an impurity of a second conductivity type opposite in polarity to said first conductivity type;

a source electrode and a drain electrode formed on said first semiconductor layer;

a plurality of fine ion implanted-area stripes formed within said first semiconductor layer near the interface of said hetero junction in the channel area between said source electrode and said drain electrode;

said impurity being implanted into said plurality of ion implanted-area stripes; and a conductive channel of fine electron accumulated area stripes within said second semiconductor layer generated at locations other than those facing said plurality of fine ion implanted-area stripes near the interface of said hetero junction, wherein a P-N junction is formed within said first semiconductor layer so that an energy at a bottom end of the conductive band is larger than the Fermi energy in said interface of said hetero junction in said respective ion implanted-area stripes.

* * * * *